United States Patent [19]

Kadowaki

[11] Patent Number: 5,057,805
[45] Date of Patent: Oct. 15, 1991

[54] MICROWAVE SEMICONDUCTOR DEVICE
[75] Inventor: Yoshinobu Kadowaki, Itami, Japan
[73] Assignee: Mitsubishi Denki Kabushiki Kaisha, Japan
[21] Appl. No.: 574,118
[22] Filed: Aug. 29, 1990
[30] Foreign Application Priority Data May 16, 1990 [JP] Japan ................................. 2-127677

[51] Int. Cl.⁵ .................... H01P 1/00; H01L 29/52
[52] U.S. Cl. ................................ 333/247; 174/52.4; 361/421; 357/70
[58] Field of Search ................ 333/238, 246, 247; 357/70; 361/421; 174/52.4

[56] References Cited

U.S. PATENT DOCUMENTS

| 3,857,115 | 12/1974 | Wisbey | 333/247 |
| 4,023,053 | 5/1977 | Shimizu et al. | 357/14 X |
| 4,276,558 | 6/1981 | Ho et al. | 333/247 X |
| 4,543,544 | 9/1985 | Ziegner | 333/238 X |
| 4,551,747 | 11/1985 | Gilbert et al. | 357/80 X |
| 4,593,243 | 6/1986 | Lao et al. | 333/238 X |
| 4,600,907 | 7/1986 | Grellman et al. | 333/246 |
| 4,689,875 | 9/1987 | Salstad | 357/70 X |
| 4,853,624 | 8/1989 | Rabjohn | 333/246 X |
| 4,991,001 | 2/1991 | Takubo et al. | 357/70 X |

Primary Examiner—Paul Gensler
Attorney, Agent, or Firm—Leydig Voit & Mayer

[57] ABSTRACT

A microwave semiconductor device includes a lead frame including a die pad and pairs of ground leads formed integrally with the die pad, a microwave semiconductor element mounted on the die pad, and a signal lead disposed between and spaced by a predetermined distance from the pair of ground leads. The signal lead is coplanar with the pair of ground leads to form a coplanar high frequency transmission path.

3 Claims, 2 Drawing Sheets

MICROWAVE SEMICONDUCTOR DEVICE

This invention relates to a microwave semiconductor device, and more specifically to a microwave semiconductor device in which ground leads and high frequency signal leads connected to a microwave semiconductor element by bonding wires form coplanar high frequency transmission paths.

BACKGROUND OF THE INVENTION

FIG. 1 is a perspective view of an example of a conventional microwave semiconductor device. The device uses a small flat package. FIG. 2 is a plan view of the microwave semiconductor device of FIG. 1 with the package removed. In FIG. 2, a microwave semiconductor element 1 is attached by, for example, soldering, to a die pad 3 of a lead frame 2. The lead frame includes also ground leads 4. The lead frame 2 is formed of, for example, an Fe-Ni alloy.

Ground terminals of the microwave semiconductor element 1 are electrically connected to the die pad 3 and, hence, to the ground leads 4 by bonding wires 5 of, for example, Au bonded to the ground terminals and the die pad 3. Signal terminals of the microwave semiconductor element 1 are electrically connected to signal leads 7 by bonding wires 6 of, for example, Au bonded to the terminals and the leads 7. The signal leads may be also formed of an Fe-Ni alloy, as the lead frame 2. The microwave semiconductor element 1, the die pad 3, and those portions of the ground leads 4 and the signal leads 7 which are adjacent to the die pad 3 are placed in a package 8. The package 8 may be formed of, for example, an epoxy resin.

When the microwave semiconductor device is connected in a microwave circuit (not shown), the ground leads 4 are connected to ground paths of the microwave circuit and the signal leads 7 are connected to signal paths of the microwave circuit.

The ground leads 4 and the signal leads 7 of the above-described conventional microwave semiconductor device function as individual ordinary leads. At high frequencies, the inductance of these leads becomes significant and may degrade the overall characteristic of the microwave semiconductor device.

The present invention provides a microwave semiconductor device free of the above-stated defect present in conventional microwave semiconductor devices. The microwave semiconductor device of the present invention has a characteristic which is not degraded at high frequencies.

SUMMARY OF THE INVENTION

A microwave semiconductor device according to the present invention comprises a lead frame including a die pad and pairs of ground leads formed integrally with the die pad, a microwave semiconductor element mounted on the die pad, and signal leads disposed between and spaced by a predetermined distance from respective pairs of ground leads. The signal leads are coplanar with the ground leads. The ground leads and the signal leads form coplanar high frequency transmission paths.

Since the ground leads to which ground terminals of the microwave semiconductor element are connected and the signal leads to which signal terminals of the element are connected are coplanar high frequency transmission paths, the inductance of the individual leads is negligible.

DESCRIPTION OF PREFERRED EMBODIMENTS

Figure 3:
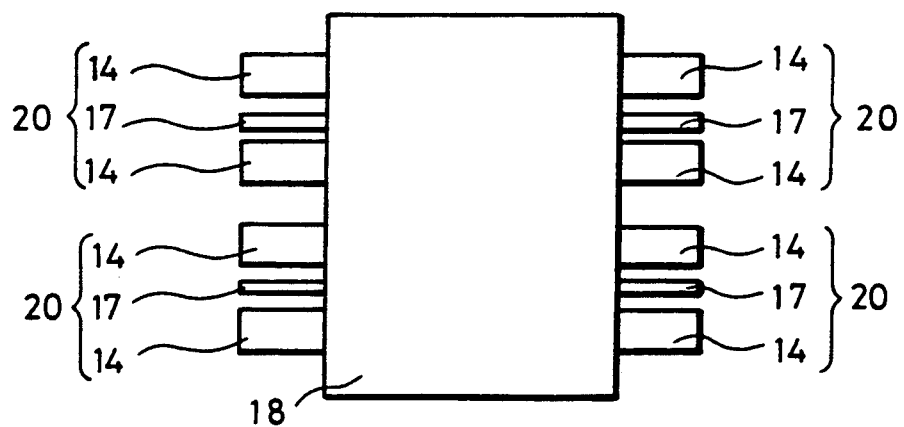
FIG. 3 is a plan view of a microwave semiconductor device according to a first embodiment of the present invention.
Figure 4:
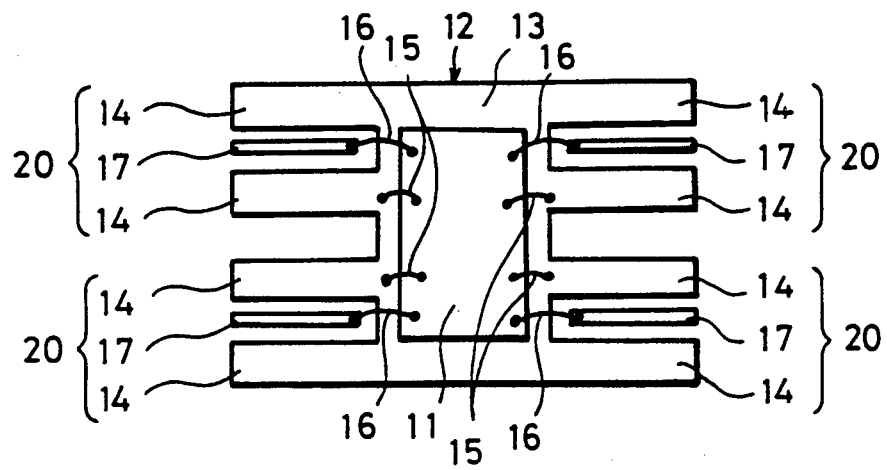
FIG. 4 is a plan view of the microwave semiconductor device of FIG. 3 with a package removed.

FIG. 3 is a plan view of a microwave semiconductor device according to a first embodiment of the present invention, in which a small flat package is used, and FIG. 4 is a plan view of the microwave semiconductor device shown in FIG. 3, but the device is shown with the package removed. In FIGS. 3 and 4, a microwave semiconductor element 11 is mounted on a die pad 13, which is a part of a lead frame 12, by, for example, soldering. The lead frame 12 includes, in addition to the die pad 13, pairs of ground leads 14 integral with the die pad 13. The lead frame 12 is formed of, for example, an Fe-Ni alloy, a copper alloy, such as phosphor bronze, or Kovar. Ground terminals of the microwave semiconductor element 11 are connected to the die pad 13 and, hence, electrically connected to the ground leads 14, by bonding wires 15 of, for example, Au, Cu or Al. A signal lead 17 is disposed between each pair of ground leads 14. The signal lead 17 is coplanar with and spaced by a given distance from the respective neighboring ground leads 14. The signal leads 17 are of, for example, an Fe-Ni alloy, a copper alloy, such as phosphor bronze, or Kovar. Signal terminals of the microwave semiconductor element 11 are electrically connected to the signal leads 17 by bonding wires 16.

According to a feature of the present invention, a pair of ground leads 14 and a signal lead 17 disposed between and spaced by a predetermined distance from the ground leads 14 form a coplanar high frequency transmission path 20. In other words, according to the present invention, ground leads and signal leads for a microwave semiconductor device are arranged by taking advantage of the conventional coplanar high frequency transmission path configuration. Accordingly, with this arrangement, the inductance of the ground leads 14 and the signal lead 17 is negligible.

Similar to conventional microwave semiconductor devices, the microwave semiconductor element 11, the die pad 13, and the portions of the ground and signal leads 14, 17 adjacent to the die pad 13 are enclosed in a package 18 which is formed of, for example, epoxy. The remaining portions of the ground and signal leads 14 and 17 laterally protrude from the package 18.

Figure 5:
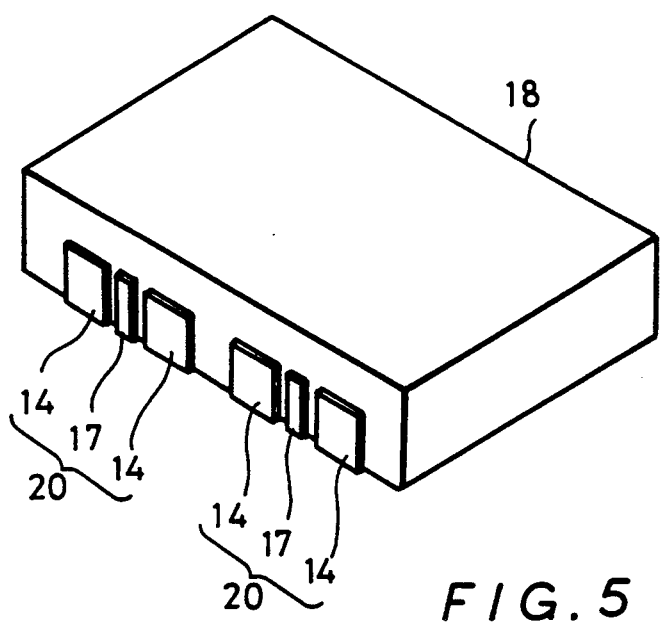
FIG. 5 is a perspective view of a microwave semiconductor device according to a second embodiment of the present invention.
Figure 6:
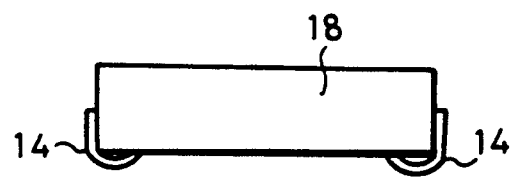
FIG. 6 is a side view of the microwave semiconductor device shown in FIG. 5.

FIG. 5 is a perspective view of a microwave semiconductor device according to a second embodiment of the present invention, and FIG. 6 is a side view of the device of FIG. 5. In this second embodiment, those portions of the ground leads 14 and the signal leads 17 which protrude from the package 18 are bent to extend along the side surfaces of the package 18, and portions of the ground and signal leads 14, 17 are further bent to lie along and on the bottom surface of the package 18 (see FIG. 6). As in the first embodiment shown in FIGS. 3 and 4, each pair of ground leads 14 and a signal lead 17 between that pair of ground leads 14 form a coplanar high frequency transmission path 20. The second embodiment is particularly effective when the microwave semiconductor device is disposed directly on a microwave circuit board, for example.

Figure 1:
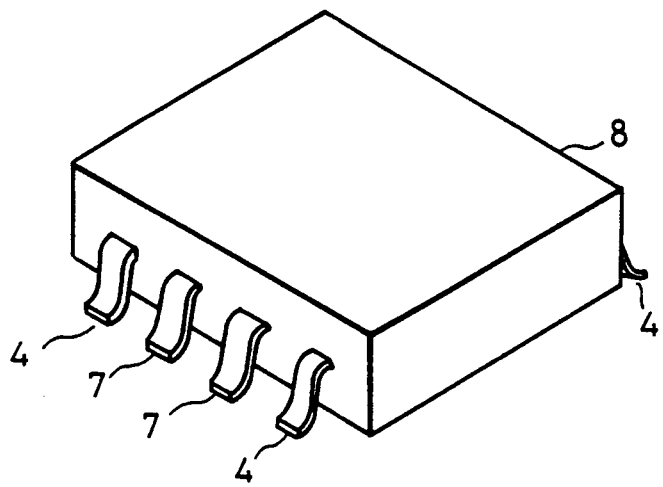
FIG. 1 is a perspective view of an example of conventional microwave semiconductor device.
Figure 2:
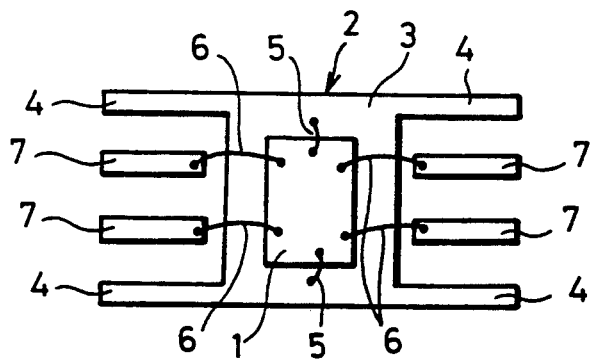
FIG. 2 is a plan view of the microwave semiconductor device of FIG. 1 with a package removed.

As described above, according to the present invention, leads from a package of a microwave semiconductor device, including ground leads and signal leads, are configured to provide coplanar high frequency transmission paths, and a microwave semiconductor element is connected directly to the coplanar high frequency transmission paths within the package. With this arrangement, the microwave semiconductor device has significantly reduced ground inductance in comparison with conventional microwave semiconductor devices, such as the one shown in FIGS. 1 and 2, and also the effects of the signal lead inductance are negligible. Thus, the present invention provides microwave semiconductor devices which exhibit superior characteristics at high frequencies.

What is claimed is:

1. A microwave semiconductor device comprising:
a unitary lead frame including a die pad and a plurality of pairs of ground leads extending from said die pad, the ground leads in each pair having substantially equal widths;
a microwave semiconductor element mounted on said die pad; and
a plurality of signal leads, each signal lead being disposed between and substantially equally spaced from each of the ground leads of a respective pair of ground leads, said signal lead being coplanar with said pair of ground leads whereby each pair of ground leads and the respective signal lead disposed therebetween form a coplanar high frequency transmission path.

2. A microwave semiconductor device according to claim 1 including a package enclosing said die pad, said microwave semiconductor element mounted on said die pad, and portions of said ground leads and said signal lead adjacent to said die pad wherein portions of said ground and signal leads not enclosed by said package extend laterally outwardly from said package.

3. A microwave semiconductor device according to claim 1 including a package having opposed side surfaces and a bottom surface extending between the side surfaces enclosing said die pad, said microwave semiconductor element mounted on said die pad, and portions of said ground leads and said signal lead adjacent to said die pad wherein portions of said ground and signal leads not enclosed by said package extend along the bottom surface and a side surface of said package.

* * * * *